(12) United States Patent
Smith et al.

(10) Patent No.: US 7,580,261 B2
(45) Date of Patent: Aug. 25, 2009

(54) SEMICONDUCTOR COOLING SYSTEM FOR USE IN ELECTRIC OR HYBRID VEHICLE

(75) Inventors: Gregory Scott Smith, Woodland Hills, CA (US); George John, Cerritos, CA (US); Terence G. Ward, Redondo Beach, CA (US); Edward P Yankoski, Corona, CA (US); David F. Nelson, Redondo Beach, CA (US)

(73) Assignee: GM Global Technology Operations, Inc., Detroit, MI (US)

( * ) Notice: Subject to any disclaimer, the term of this patent is extended or adjusted under 35 U.S.C. 154(b) by 189 days.

(21) Appl. No.: 11/685,726

(22) Filed: Mar. 13, 2007

(65) Prior Publication Data

US 2008/0225482 A1 Sep. 18, 2008

(51) Int. Cl.
*H05K 7/20* (2006.01)
*F28F 7/00* (2006.01)
*F25D 17/02* (2006.01)

(52) U.S. Cl. ............... 361/699; 165/80.4; 165/80.5; 165/104.33; 174/15.1; 257/714; 62/64; 62/259.2

(58) Field of Classification Search ......... 361/698–700; 165/80.4–80.5, 104.33; 174/15.1; 257/714; 65/64, 259.2
See application file for complete search history.

(56) References Cited

U.S. PATENT DOCUMENTS

| 6,445,568 B1 * | 9/2002 | Baur et al. ................. 361/600 |
| 7,477,513 B1 * | 1/2009 | Cader et al. ................. 361/699 |

* cited by examiner

*Primary Examiner*—Jayprakash N Gandhi
*Assistant Examiner*—Zachary M Pape

(57) ABSTRACT

A cooling system is provided for use in conjunction with a semiconductor assembly including a first semiconductor device and a second semiconductor device electrically coupled to the first semiconductor device by an elongated electrical connection. The cooling system includes a flow passage, a pump fluidly coupled to the flow passage, and an outlet array fluidly coupled to the flow passage and configured to direct a coolant fluid over the second semiconductor device. The outlet array has an interconnect feature formed therein configured to receive the elongated electrical connection there through.

9 Claims, 2 Drawing Sheets

SEMICONDUCTOR COOLING SYSTEM FOR USE IN ELECTRIC OR HYBRID VEHICLE

TECHNICAL FIELD

The present invention generally relates to a semiconductor cooling system of the type used in an electric or hybrid vehicle and, more particularly, to an outlet array having an integral interconnect feature.

BACKGROUND OF THE INVENTION

Power semiconductor devices are commonly utilized as switches or rectifiers in high-power electric circuits. Certain power semiconductor devices generate heat during operation and may thus require thermal regulation to ensure proper functioning. For this reason, assemblies employing multiple semiconductor devices are typically provided with some form of cooling system. Power inverter assemblies employed onboard electric or hybrid vehicles, for example, generally include an integrated cooling system that functions to conductively and/or convectively cool a plurality of active inverter switches.

One type of cooled inverter assembly comprises a plastic body (referred to as a "pressure spread") disposed between a printed circuit board (e.g., a gate driver board) and a substrate supporting multiple inverter switches. The gate driver board is electrically coupled to the inverter switches via a plurality of electrical connections (e.g., pins, spring pins, wires, etc.). A heat sink (e.g., a metal body having a plurality of projections, or pin-fins, extending away therefrom) is disposed beneath the substrate. The pressure spread presses the substrate against the heat sink to place the active inverter switches in thermal contact with the heat sink. During operation, heat produced by the inverter switches is conducted through the substrate and into the heat sink's pin-fins, which are then cooled by a convective cooling source, such as air or a coolant liquid (e.g., glycol water).

Cooled inverter assemblies of the type described above are limited in certain respects. For example, due to a relatively high part count and the inclusion of a heat sink, such assemblies are typically bulky, less durable, and relatively expensive to employ. In addition, such assemblies are typically only moderately effective at dissipating heat. Liquid-cooled semiconductor assemblies, which actively circulate a coolant fluid over the semiconductor devices, are more effective at dissipating heat; however, such semiconductor assemblies typically employ an outlet array positioned over the semiconductor device that obstructs any direct electrical connection between the cooled semiconductor devices and a second semiconductor device (e.g., a printed circuit board) residing above the outlet array.

Considering the foregoing, it should be appreciated that it would be desirable to provide a vehicular semiconductor cooling system incorporating an outlet array having an integral interconnect feature. It should further be appreciated that it would be desirable to provide a vehicular inverter assembly employing such a cooling system that is relatively compact, durable, and inexpensive to employ. Furthermore, other desirable features and characteristics of the present invention will become apparent from the subsequent detailed description and the appended claims, taken in conjunction with the accompanying drawings and the foregoing technical field and background.

SUMMARY OF THE INVENTION

A cooling system is provided for use in conjunction with a semiconductor assembly including a first semiconductor device and a second semiconductor device electrically coupled to the first semiconductor device by an elongated electrical connection. The cooling system includes a flow passage, a pump fluidly coupled to the flow passage, and an outlet array fluidly coupled to the flow passage and configured to direct a coolant fluid over the second semiconductor device. The outlet array has an interconnect feature formed therein configured to receive the elongated electrical connection therethrough.

DESCRIPTION OF THE DRAWINGS

The present invention will hereinafter be described in conjunction with the following drawing figures, wherein like numerals denote like elements, and.

DESCRIPTION OF AT LEAST ONE EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary, or the following detailed description.

Figure 1:
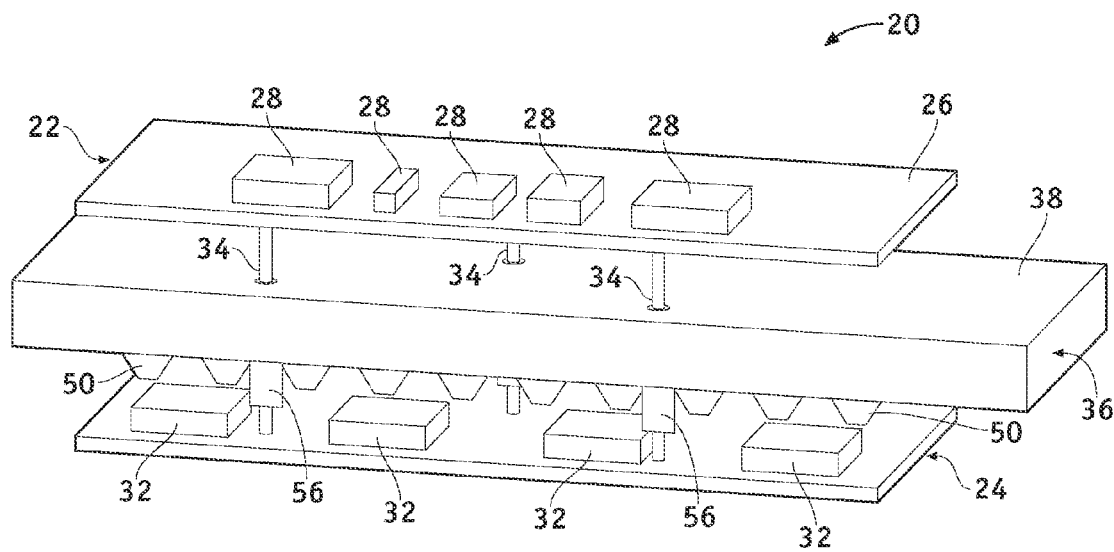
FIGS. 1 and 2 are isometric and cross-sectional views, respectively, of a cooled power semiconductor assembly in accordance with a first exemplary embodiment of the present invention.
Figure 2:
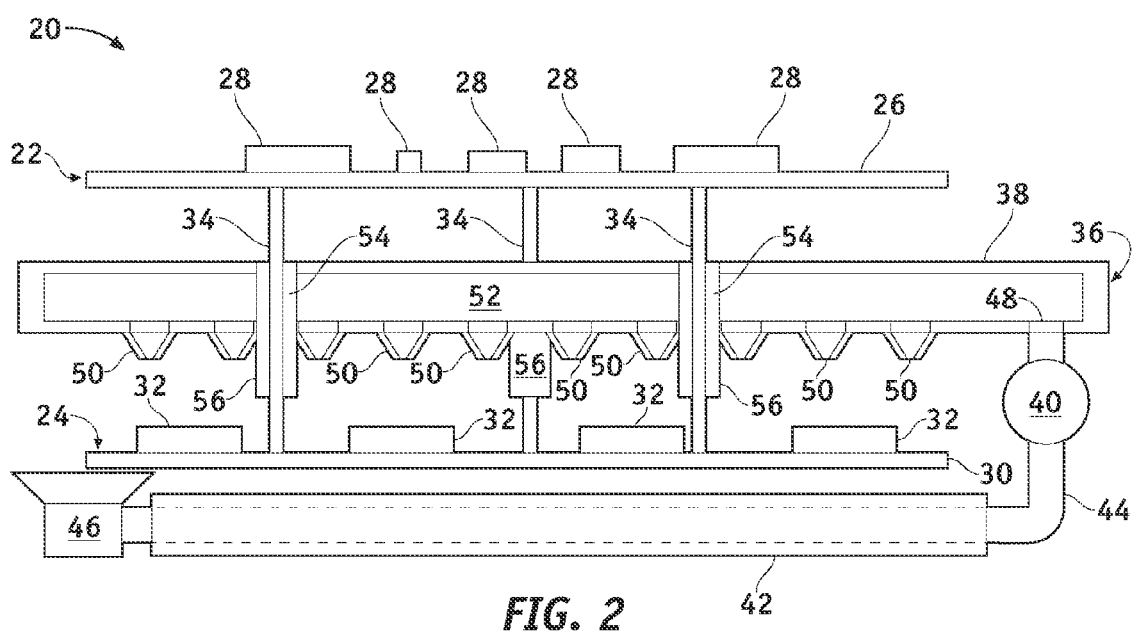

FIGS. 1 and 2 are isometric and cross-sectional views, respectively, of a liquid-cooled power semiconductor assembly 20 in accordance with a first exemplary embodiment of the present invention. Cooled semiconductor assembly 20 may be, for example, an inverter of the type employed by electric and hybrid vehicles to provide three phase operating power to the vehicle's electric drive motor. Assembly 20 comprises a first semiconductor sub-assembly 22 and a second semiconductor sub-assembly 24. First semiconductor sub-assembly 22 comprises a substrate 26 (e.g., a printed circuit board, such as a gate driver board) supporting a first plurality of power semiconductor devices 28 (collectively referred to as "control circuitry"), and second semiconductor sub-assembly 24 comprises a substrate 30 carrying a second plurality of power semiconductor devices 32 (e.g., inverter switches). Substrate 30 may be a direct bonded copper substrate (e.g., a copper-coated aluminum oxide or ceramic substrate), and power semiconductor devices 32 may be soldered to substrate 30; however, it should be appreciated that other substrates and attachment means may be utilized.

Liquid-cooled power semiconductor assembly 20 further comprises a plurality of electrical interconnects or connections 34. Electrical connections 34 each comprise an elongated, conductive body, such as a pin (illustrated), a spring pin, or a wire. Electrical connections 34 contact a portion of semiconductor sub-assembly 22 (e.g., a conductor on the underside of substrate 26) and a portion of semiconductor sub-assembly 24 (e.g., a conductor on the upper surface of substrate 30) to electrically couple sub-assembly 22 to sub-assembly 24 and, therefore, control circuitry 28 to inverter switches 32. Electrical connections 34 may be fixedly coupled to sub-assembly 22 and/or sub-assembly 24 by way of, for example, soldering. However, electrical connections 34 may not be fixedly coupled to either sub-assembly 22 or sub-assembly 24, and may instead be retained between sub-assemblies 22 and 24 in the manner described below.

During operation of power semiconductor assembly 20, heat is generated by active inverter switches 32. To dissipate this heat, power semiconductor assembly 20 is provided with a liquid-cooling system 36. As will be described in detail below, cooling system 36 is configured to circulate a coolant fluid over active inverter switches 32 and/or substrate 30 to convectively cool switches 32. The coolant fluid is preferably a dielectric liquid (e.g., fluorocarbon, silicone oil, or polyalphaolephin), although it will be appreciated that the particular coolant fluid selected will depend upon device chemistry and application.

As can be seen in FIG. 2, cooling system 36 comprises an outlet array 38, a pump 40, a cooling device 42, and a flow passage 44 including an inlet or fluid pick-up 46. Outlet array 38 includes an internal conduit 52 having an array inlet 48, and a plurality of impingement outlets 50 each fluidly coupled to conduit 52. Outlet array 38 is disposed beneath semiconductor sub-assembly 22 and over semiconductor sub-assembly 24, and is provided with a plurality of integrated interconnect features that receive electrical connections 34 therethrough as described in more detail below. Impingement outlets 50 are positioned so as to direct circulating coolant fluid onto the top surfaces of active inverter switches 32 and/or substrate 30; e.g., each of outlets 50 may be disposed substantially above a different one of inverter switches 32. Impingement outlets 50 may assume any form suitable for directing circulating coolant fluid onto switches 32 and/or substrate 30. For example, impingement outlets 50 may each take the form of one or more holes created through the underside of outlet array 38. However, impingement outlets 50 each preferably comprise a fluid flow jet configured to create a stream of coolant fluid, or a spray nozzle configured to produce a fine or atomized mist. Embodiments of outlet array 38 may employ fluid flow jets, spray nozzles, or a combination of jets and nozzles depending upon desired performance characteristics. Spray nozzles tend to provide more efficient thermal cooling, while fluid flow jets help to preserve coolant fluid quality and may permit pump 40 to be of the low pressure variety thereby reducing cost and increasing system reliability.

When pump 40 is energized, coolant fluid flows through flow passage 44, into outlet array 38, and over inverter switches 32 and/or substrate 30. As the coolant fluid contacts switches 32 and substrate 30, heat is convectively transferred from the active inverter switches 32 to the coolant fluid. The heated fluid is then collected at fluid pick-up 46 and drawn through flow passage 44 by pump 40. Cooling device 42 cools the heated coolant fluid as it flows through flow passage 44. Cooling device 42 may comprise any device suitable for this purpose, including, but not limited to, various types of heat exchangers and heat sinks. Next, the cooled coolant fluid enters outlet array 38 through array inlet 48. The coolant fluid flows along conduit 52 to impingement outlets 50, which then direct the coolant fluid over the active inverter switches 32. This cycle is repeated to continually regulate the temperature of switches 32.

As previously indicated, outlet array 38 includes a plurality of integrated interconnect features that receive electrical connections 34 therethrough. As shown in FIG. 2, these interconnect features may comprise a plurality of channels 54 that extends through outlet array 38 (e.g., from the upper surface to the lower surface of array 38). Channels 54 permit electrical connections 34 to pass through outlet array 38 thereby facilitating the interconnection of sub-assemblies 22 and 24. In certain embodiment, channels 54 may also serve as retaining features that maintain the spatial orientation of electrical connections 34 when, for example, connections 34 are not fixedly coupled to either substrate 26 or substrate 30.

Outlet array 38 may further comprise a plurality of connection guides 56. Guides 56 are fixedly coupled to (e.g., integrally formed with) the body of outlet array 38 and may cooperate therewith to define channels 54. In the illustrated embodiment, guides 56 comprise a plurality of elongated tubular bodies extending at least partially through outlet array 38. Guides 56 may transect conduit 52 or may, instead, be offset to either side of conduit 52 as shown in FIG. 2. The longitudinal axes of guides 56 (and thus of channels 54) may be substantially perpendicular to the longitudinal axis of conduit 52. If desired, guides 56 may protrude from the lower surface of array 38 and may contact the upper surface of substrate 30 to further support outlet array 38.

Outlet array 38 may be formed from a variety of materials, including, but not limited to, various plastics, metals, and alloys. For example, outlet array 38 may be formed from injection-molded plastic, and channels 54 and/or guides 56 may be directly molded into the body of outlet array 38. If a conductive metal or alloy (e.g., aluminum or copper) is utilized, electrical connections 34 should be electrically insulated from outlet array 38. This may be accomplished by disposing insulative sleeves (not shown) within channels 54 such that each sleeve resides between the inner surface of a channel and outer surface of the electrical connection passing therethrough.

Figure 3:
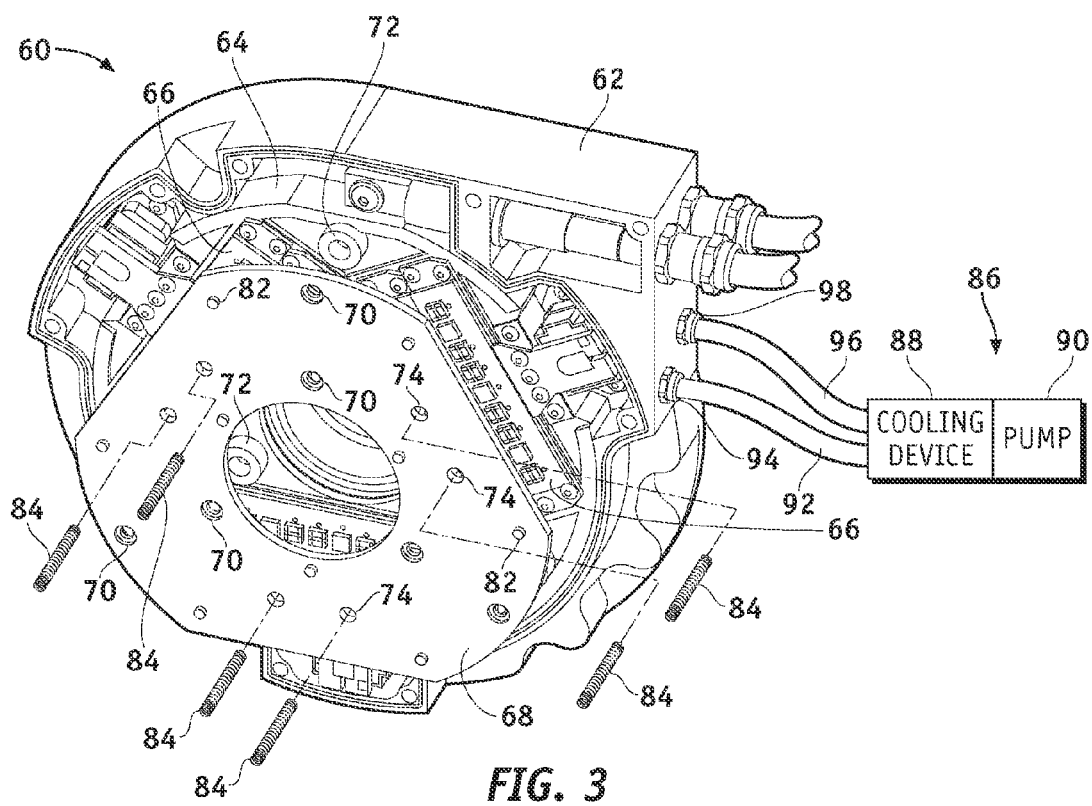
FIGS. 3 and 4 are exploded and isometric views, respectively, of a cooled inverter assembly in accordance with a second exemplary embodiment of the present invention.
Figure 4:
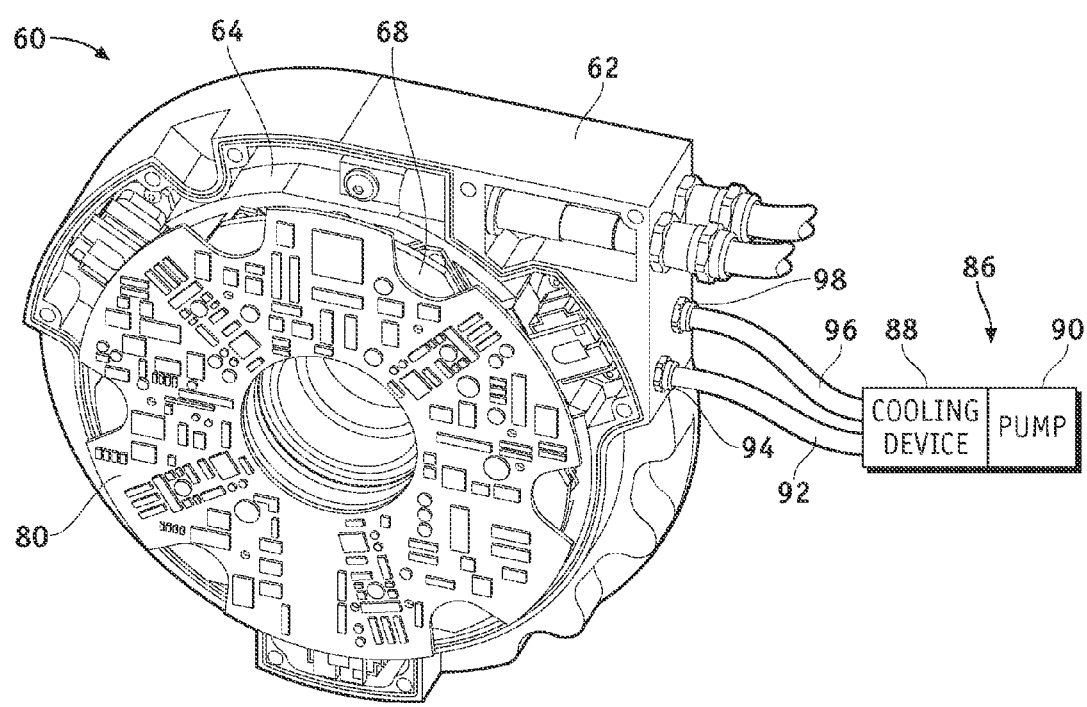

FIGS. 3 and 4 are exploded and isometric views, respectively, of a liquid-cooled inverter assembly 60 in accordance with a second exemplary embodiment of the present invention. Cooled inverter assembly 60 comprises a housing 62 (e.g., plastic) having a capacitor assembly 64, a plurality of inverter devices 66 (FIG. 3), and an annular outlet array (e.g., a spray array) 68 disposed therein. Inverter devices 66 are mounted on capacitor assembly 64, and spray array 68 is positioned within housing 62 so as to direct coolant fluid over inverter devices 66 (e.g., spray array 68 may be disposed above inverter devices 66 as shown in FIG. 3). A first plurality of mounting features 70 may be provided along the underside of spray array 68 and configured to engage corresponding mounting features 72 provided on capacitor assembly 64. Spray array 68 comprises a body, an array of spray nozzles coupled to the underside of the body (hidden from view in FIGS. 3 and 4), and a plurality of integrated interconnect features 74 formed in the spray array body. Interconnect features 74 each receive one of a plurality of elongated connections 84 therethrough, which electrically couple inverter devices 66 to a printed circuit board (e.g., a gate driver board) in the manner described below. Interconnect features 74 may comprise, for example, a plurality of retaining channels each having an inner diameter substantially equivalent to (i.e., slightly greater than) the outer diameter of the received elongated connections.

After spray array 68 is positioned over inverter devices 66, each of a plurality of spring pins 84 (FIG. 3) is disposed through one of the interconnect features 74. Next, gate driver board 80 (FIG. 4) is disposed over spray array 68 such that the underside of gate driver board 80 contacts a second plurality of mounting features 82 provided on the upper surface of spray array 68 (FIG. 3). Finally, a cover (not shown) may be coupled to housing 62 (e.g., via a plurality of fasteners). When inverter assembly 60 is assembled in this manner (FIG. 4), spring pins 84 are compressed between and electrically couple inverter devices 66 and gate driver board 80. In this manner, interconnect features 74 permit inverter devices 66 and gate driver board 80 to be electrically coupled. In addition, interconnect features 74 help maintain the spatial orientation of spring pins 84 relative to inverter devices 66, gate driver board 80, and spray array 68.

Inverter assembly 60 may be coupled to a coolant circulation system 86, which continually exchanges coolant with inverter assembly 60. In the illustrated embodiment, coolant circulation system 86 comprises a cooling device (e.g., a heat exchanger) 88 and a pump 90. Coolant circulation system 86 is coupled to an inlet 94 and an outlet 98 provided on inverter assembly 60 by way of a fluid delivery tube 92 and a fluid removal tube 96, respectively. Coolant circulation system 86 removes heated coolant fluid from assembly 60 via fluid removal tube 96, cools the heated coolant fluid, and then returns the fluid via fluid delivery tube 94. The cooled coolant fluid received at inlet 94 is provided to spray array 68, which then directs the fluid over inverter devices 66 in the manner described above. This example notwithstanding, it should be appreciated that cooling device 88 and, perhaps, other components of coolant circulation system 86 may be incorporated into inverter assembly 60 (e.g., built into the cover of the unit).

In view of the above, it should be appreciated that a semiconductor cooling system has been provided that incorporates an outlet array having an integral interconnect feature. It should further be appreciated that an inverter assembly has been provided employing such a cooling system that is relatively compact, durable, and inexpensive to employ. While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A cooled semiconductor assembly for use in conjunction with a circulation system including a pump and a cooling device, the pump configured to circulate a coolant fluid through the circulation system and the cooling device configured to cool the circulated fluid, the cooled semiconductor assembly comprising:
    a housing;
    a printed circuit board disposed in the housing;
    an inverter switch disposed in the housing;
    an outlet array fluidly coupled to the circulation system and positioned within the housing so as to direct coolant fluid over the invert switch, the outlet array having an interconnect feature formed therein; and
    an elongated electrical connection extending through the interconnect feature to electrically couple the printed circuit board to the inverter switch.

2. A cooling system according to claim 1 wherein the outlet array comprises a plurality of spray nozzles.

3. A cooled semiconductor assembly according to claim 1 wherein the interconnect feature comprises a retaining channel.

4. A cooled semiconductor assembly according to claim 1 wherein the outlet array comprises injection-molded plastic.

5. A cooled semiconductor assembly for use in conjunction with a circulation system including a pump and a cooling device, the pump configured to circulate a coolant fluid through the circulation system and the cooling device configured to cool the circulated fluid, the cooled semiconductor assembly comprising:
    a housing
    a first semiconductor device disposed in the housing;
    a second semiconductor device disposed in the housing;
    an outlet array fluidly coupled to the circulation system and positioned within the housing so as to direct coolant fluid over the second semiconductor device, the outlet array having an interconnect feature formed therein; and
    a spring pin extending through the interconnect feature to electrically couple the first semiconductor device to the second semiconductor device, the spring pin compressed between the first semiconductor device and the second semiconductor device.

6. A cooling system according to claim 5 wherein the interconnect feature comprises a channel extending through the outlet array.

7. A cooling system according to claim 5 wherein the outlet array comprises an insulative material.

8. A cooling system according to claim 5 wherein the outlet array comprises injection-molded plastic.

9. A cooled semiconductor assembly for use in conjunction with a circulation system including a pump and a cooling device, the pump configured to circulate a coolant fluid through the circulation system and the cooling device configured to cool the circulated fluid, the cooled semiconductor assembly comprising:
    a housing;
    a first semiconductor device disposed in the housing;
    a second semiconductor device disposed in the housing;
    an outlet array fluidly coupled to the circulation system and positioned within the housing so as to direct coolant fluid over the second semiconductor device, the outlet array having an interconnect feature formed therein and further including a first major surface and a second major surface substantially opposite the first major surface, the first major surface contacting the first semiconductor device and the second major surface contacting the second semiconductor device; and
    an elongated electrical connection extending through the interconnect feature to electrically couple the first semiconductor device to the second semiconductor device.

* * * * *